United States Patent
Andersen et al.

(10) Patent No.: US 12,133,359 B2
(45) Date of Patent: Oct. 29, 2024

(54) RADIATOR WITH ADAPTED FINS

(71) Applicant: ASETEK DANMARK A/S, Aalborg East (DK)

(72) Inventors: Martin Rønnov Andersen, Aalborg East (DK); Anders Hjørringgaard Saksager, Gistrup (DK)

(73) Assignee: Asetek Danmark A/S, Aalborg Øst (DK)

( * ) Notice: Subject to any disclaimer, the term of this patent is extended or adjusted under 35 U.S.C. 154(b) by 0 days.

(21) Appl. No.: 18/257,286

(22) PCT Filed: Dec. 14, 2021

(86) PCT No.: PCT/EP2021/085670
§ 371 (c)(1),
(2) Date: Jun. 13, 2023

(87) PCT Pub. No.: WO2022/129035
PCT Pub. Date: Jun. 23, 2022

(65) Prior Publication Data
US 2024/0040744 A1    Feb. 1, 2024

(30) Foreign Application Priority Data
Dec. 14, 2020  (EP) .................................. 20213780

(51) Int. Cl.
*H05K 7/20*    (2006.01)
*B21D 53/02*   (2006.01)

(52) U.S. Cl.
CPC ....... *H05K 7/20263* (2013.01); *B21D 53/022* (2013.01); *H05K 7/20172* (2013.01)

(58) Field of Classification Search
CPC ............. F28D 1/05391; F28D 1/05366; F28D 1/05383; F28D 1/024; F28D 1/0471;
(Continued)

(56) References Cited

U.S. PATENT DOCUMENTS

| | | | | |
|---|---|---|---|---|
| 4,441,547 A | * | 4/1984 | Argyle .................... | F28F 9/002 180/68.1 |
| 5,509,469 A | * | 4/1996 | Obosu .................... | F28F 1/325 165/182 |

(Continued)

FOREIGN PATENT DOCUMENTS

| | | |
|---|---|---|
| DE | 102010027053 A1 | 1/2012 |
| EP | 2817578 A1 | 12/2014 |

(Continued)

OTHER PUBLICATIONS

Hangzhou et al. A micro-channel heat exchange and application thereof in system, PE2E NPL, CN-106322842-A, Jan. 11, 2017, (Year: 2017).*

(Continued)

*Primary Examiner* — Michael A Matey
(74) *Attorney, Agent, or Firm* — Finnegan, Henderson, Farabow, Garrett & Dunner, LLP (57) ABSTRACT

There is a need for better cooling solutions for the ever-increasing thermal density of computing systems. This is solved by providing a radiator (100) for a liquid cooling system for cooling a computing unit, the radiator comprising:—a first manifold (101) and a second manifold (102) having among them two liquid openings (103, 104) for connecting the radiator in a liquid loop, —channels (110) extending between the first manifold (101) and the second manifold (102) and providing parallel liquid paths between the manifolds (101, 102), —fin layers (130) sandwiched between sets of neighbouring channels (110) and extending between the first manifold (101) and the second manifold (102), —fastening means (120) for attaching a fan (10) to the radiator (100) in a predetermined position, determining a ring-shaped high-pressure zone (142) corresponding to an outer area of a fan radius (122) of an attached fan, where—at least one fin layer has a low-density section placed away (Continued)

from the high-pressure zone, and a high-density section being located in the high-pressure zone and having a higher fin density than the low-density section, —the density of the group of fin layers thereby varies both along the channels but also transverse of each channel, resulting in two-dimensional density variations across the radiator surface, sections of fins to be positioned in front of the ring-shaped high-pressure zone has a higher density than the section of fins away from the ring-shaped high-pressure zone.

15 Claims, 4 Drawing Sheets (58) Field of Classification Search
CPC ........ F28D 1/047; F28D 9/005; F28D 9/0062; F28D 9/0075; F28F 2260/02; F28F 1/126; F28F 1/022; F28F 2215/04; F28F 1/128; F28F 2250/02; F28F 2210/00; F28F 2009/029; F28F 2215/00; F28F 2250/08; F28F 9/262; G06F 1/20; H05K 7/2029; H05K 7/20263; H05K 7/20172; B21D 53/022
See application file for complete search history.

(56) References Cited

U.S. PATENT DOCUMENTS

| | | | | |
|---|---|---|---|---|
| 5,765,630 A * | 6/1998 | Bloomer | ............... | F28D 1/0471 |
| | | | | 415/208.2 |
| 2004/0083740 A1* | 5/2004 | Taban | ................ | B60H 1/00478 |
| | | | | 62/428 |
| 2007/0091571 A1* | 4/2007 | Malone | .............. | H05K 7/20772 |
| | | | | 361/699 |
| 2007/0209786 A1* | 9/2007 | Shimoya | ................. | F28F 1/128 |
| | | | | 165/152 |
| 2008/0190588 A1* | 8/2008 | Heidenreich | ........... | F28F 1/325 |
| | | | | 165/181 |
| 2010/0006276 A1* | 1/2010 | Cremaschi | ........... | B21D 53/085 |
| | | | | 165/173 |
| 2010/0186935 A1* | 7/2010 | Wand | ........................ | F28F 1/00 |
| | | | | 165/173 |
| 2010/0252242 A1* | 10/2010 | Xiangxun | ........... | F28D 1/05391 |
| | | | | 165/173 |
| 2011/0061845 A1* | 3/2011 | Wand | .................... | F28F 9/0224 |
| | | | | 165/173 |
| 2011/0088883 A1* | 4/2011 | de la Cruz | .............. | F28F 1/022 |
| | | | | 165/173 |
| 2011/0203780 A1* | 8/2011 | Jiang | ..................... | F28F 9/0273 |
| | | | | 165/173 |
| 2012/0055657 A1* | 3/2012 | Moser | .................... | B21D 53/04 |
| | | | | 165/181 |
| 2013/0020060 A1* | 1/2013 | Moser | .................... | F28F 1/126 |
| | | | | 137/561 R |
| 2015/0122467 A1* | 5/2015 | Shi | .......................... | F28F 3/048 |
| | | | | 165/166 |
| 2015/0204615 A1* | 7/2015 | Stafford | .................. | B23P 15/26 |
| | | | | 29/890.035 |
| 2016/0205808 A1* | 7/2016 | Yuque | ...................... | F16B 2/22 |
| | | | | 165/80.4 |
| 2016/0263703 A1* | 9/2016 | Eldred | ................. | B23K 26/244 |
| 2017/0245394 A1* | 8/2017 | Matte | ........................ | F28F 3/06 |
| 2017/0367217 A1* | 12/2017 | Xiao | ..................... | H01L 23/467 |
| 2018/0196483 A1* | 7/2018 | Han | .................... | H01L 23/3672 |

FOREIGN PATENT DOCUMENTS

| | | |
|---|---|---|
| KR | 20070064958 A | 6/2007 |
| KR | 20080110210 A | 12/2008 |
| WO | WO 2013/124096 A1 | 8/2013 |
| WO | WO 2015107419 A1 | 7/2015 |

OTHER PUBLICATIONS

Extended European Search Report received in European Application No. 20213780.8 dated Jun. 9, 2021 (11 pgs.).

International Search Report and Written Opinion of the International Searching Authority received in relation to International Application No. PCT/EP2021/085670, mailed on Apr. 4, 2022, (11 pages.).

* cited by examiner

RADIATOR WITH ADAPTED FINS

RELATED APPLICATIONS

This application is a U.S. national stage entry under 35 U.S.C. § 371 of international application no. PCT/EP2021/085670, filed Dec. 14, 2021, which designates the U.S. and claims priority to European Application No. 20213780.8 filed Dec. 14, 2020. The contents of these applications are herein incorporated by reference in their entirety.

FIELD OF THE INVENTION

The invention relates to a radiator, a liquid cooling system having the radiator, a computing system with the liquid cooling system having the radiator, and a method of manufacturing the radiator.

BACKGROUND OF THE INVENTION

Computing systems are increasingly required to have high power density, whether this is through being small and compact or through the processing units being more and more powerful thus raising the thermal design power. Liquid cooling solutions provide efficient heat dissipation and thus offer a large thermal envelope. The aim of any liquid cooling system is conventionally for its thermal envelope to match or exceed the thermal design power of the computing system.

Liquid cooling a central processing unit (CPU) comprises pumping a cooling liquid in a loop through a heat-exchanging block that draws heat from the CPU to a radiator, where the heat is dissipated from the water to the air by using fans, and back to the CPU-block to absorb heat therefrom anew. The thermal envelope is then largely dependent on the liquid cooling loop components.

Radiator design has been the subject of much attention, where heat dissipation density is sought while achieving low noise and slimness. Today, effective radiators are built with thicknesses between less than 30 mm and more than 54 mm, and a fin density ranging around 16 fins per inch (FPI) depending on acceptable noise levels. Power-adapted radiators accept noise by having high fin densities that produce flow resistance and thus require high fan speeds. Low-noise systems use low fin density fins to allow lower airflow velocities to flow among the fins. The design objective of the system determines whether a silent or a powerful radiator is used.

However, even with effective radiators for different uses, thermal design power increases. Today, consumers must choose between a powerful and silent but large computer, a powerful and small but noisy computer, or a small and silent but power-constricted computer.

There is thus a need for a better radiator.

KR20070064958 illustrates a radiator with two different fin densities between the channels the fin density between all channels in front of the fan similar and higher, whereas channels not in front of the fan has another fin density therebetween which is lower.

SUMMARY OF THE INVENTION

In an aspect of the invention, there is provided a radiator for a liquid cooling system for cooling a computing unit, the radiator comprising:

- a first manifold and a second manifold having among them two liquid openings, for connecting the radiator in a liquid loop,
- channels extending between the first manifold and the second manifold and providing parallel liquid paths between the manifolds,
- fin layers sandwiched between sets of neighbouring channels and extending between the first manifold and the second manifold,
- fastening means for attaching a fan to the radiator in a predetermined position, determining a ring-shaped high-pressure zone corresponding to an outer area of a fan radius of an attached fan, where
- at least one fin layer has a low-density section placed away from the high-pressure zone, and a high-density section being located in the high-pressure zone and having a higher fin density than the low-density section,
- the density of the group of fin layers thereby varies both along the channels but also transverse of each channel, resulting in two-dimensional density variations across the radiator surface, sections of fins to be positioned in front of the ring-shaped high-pressure zone has a higher density than the section of fins away from the ring-shaped high-pressure zone.

Thereby, a radiator is achieved that is adapted to the specific airflow types generated over the area of fans attached to the radiator. Fin densities adapted to low-flow systems are used, where there is a low airflow locally, while higher density fins are used where there is high flow/pressure. This takes better advantage of the airflow by counter-intuitively providing a radiator with a more homogenous cooling.

In contrast, traditional radiators sacrifice performance of certain areas of the radiator to the benefit of other areas. High-flow adapted radiators have fin densities that are adapted to the high-pressure areas to the detriment of the middle of the radiator that may almost negate airflow there thus hampering thermal work.

Low-flow adapted radiators may allow more air through low-flow regions of the radiator at the cost of an overabundance of airflow at the high-pressure zone. Such overabundance of airflow carries an underutilised cooling potential and thus wastes energy and produces noise that is disadvantageous, especially in such systems.

In other words, the radiator of the invention can increase the thermal performance of high-flow adapted cooling systems and reduce noise of low-flow adapted liquid cooling systems (and vice versa).

The fastening means, which allow attaching a fan, also define for such fan a rotational axis, a fan radius and a radial periphery.

By high-pressure zone is meant the area of the radiator that corresponds to a specific portion of an attached fan, namely the part of such fan, where the highest flow and/or pressure is generated, if the fan is tested with a radiator with homogenous fin density or without a radiator. The high-pressure zone can also be considered a high-pressure zone. In an embodiment, the high-pressure zone corresponds to the outer part of a fan blade of an attached fan by corresponding substantially to the area defined between r=65% and r=90-95% of the fan blade length/fan radius. However, this obviously depends on the fan design.

In an embodiment, the high-pressure zone corresponds to an area within which 50% of the airflow is generated by a reference fan, an area within which 60% of the airflow is generated by a reference fan, an area within which 70% of the airflow is generated by a reference fan, an area within which 75% of the airflow is generated by a reference fan, an area within which 80% of the airflow is generated by a reference fan, an area within which 85% of the airflow is generated by a reference fan, or an area within which 90% of the airflow is generated by a reference fan.

The high-pressure zone may be said to be annulus-shaped.

Fin density is measured conventionally in the art as fins per inch (FPI) and ranges between anything from 8 FPI to over 30 FPI. For some applications, about 16 FPI have been found to be an effective fin density, though this obviously varies with many other factors like radiator and fin depth, fan material and fan rotational speed. In the invention, however, the FPI may take values outside of this range and is preferably determined based on expected flow at least substantially proportionally thereto, though design considerations may overrule the specific fin densities at certain sections. In one embodiment, any radiator fin densities between 2 and 50 FPI can be used.

In an embodiment, the radiator further comprises at least a peak-type fin layer and a valley-type fin layer. The peak-type fin layer has a fin density that is greater in its middle than at either of its ends, and the valley-type fin layer has a fin density that is lower in its middle than at either of its ends.

Thereby, a radiator is provided that has two oppositely oriented thermal work gradients that further increase the thermal performance of a radiator with a fan attached.

In an embodiment, the radiator has an array of fin sections formed by the fin layers each having a plurality of fin sections. Overlaying a fan airflow map indicative of airflow generated by an attached fan over the fin section array assigns each fin section with a weighted airflow score. The weighted airflow score indicates the airflow at that fin section. The fin density of at least a majority of fin sections is determined individually for each fin section and correlates positively with the individually weighted airflow score for each fin section.

Thereby, a radiator is provided that provides even further adaptation of the fin densities to the fan velocity function. In an embodiment, the fin sections are of similar size. In an embodiment, the fin sections are identically sized.

The fan airflow map may be an idealised or averaged map describing an idealised fan or it may be experimentally determined for a specific fan model or several fan models. The fan airflow map may be developed based on thermal mapping of a radiator attached to a fan, an airflow velocity function of a fan or of several fans, or on pressure measurements over the fan radius/surface.

The fin density of at least a majority of fin sections correlating positively with their individual weighted airflow score denotes that at least half of the surface of the radiator is adapted according to the invention to the specific airflow profile of that specific area. In another embodiment, substantially every fin section has a fin density correlating positively with its individually weighted airflow score.

Weighted airflow score denotes that the scores of each fin section are mutually adjusted with each other. In other words, it is not necessary that the measurements are made in any specific units. Rather, it is the relationship between the airflow scores of different fin sections that matters. Synthetic values of numbers without units are useful as well as using different values than airflow. Pressure and temperature are useful too.

The fin density of fin sections being positively correlated with a weighted airflow score denotes that among the fin sections, those with relatively higher weighted airflow scores have higher fin densities than other sections with lower airflow scores. In a preferred embodiment, the fin density correlates positively with the airflow score in a linear, proportional, progressive or regressive mathematical relationship. In other words, three fin sections with weighted airflow scores of "1, 2 and 3" in whatever measurement values are used, such as m/s or pressure, may have fin densities that are linear to these values, such as 12 FPI, 16 FPI and 20 FPI. Fin densities may even be proportional to weighted airflow scores, such as 8 FPI, 16 FPI and 24 FPI. Fin densities may be progressively correlated to the weighted airflow scores so that the fin densities could for example be 12 FPI, 16 FPI and 24 FPI. Fin densities may be regressively correlated to the weighted airflow scores, so that the fin densities could for example be 8 FPI, 16 FPI and 20 FPI.

Thereby, the thermal work capacity of each section is further utilised, and the radiator provides even further cooling.

In an embodiment, substantially all fin sections have fin densities that thus correlate positively to their weighted airflow scores.

In an embodiment, the radiator comprises fin sections with at least three, preferably at least four different fin densities.

Thereby, the thermal work capacity of each section is further utilised, and the radiator provides even further cooling.

In an embodiment, the fin layers comprise continuous serpentine fins. Thereby, they are more production-friendly to handle and stack during assembly.

The fin layers being continuous serpentine fins denotes that the fin layers are continuous pieces of material instead of for example a milled block. Each fin layer may be separated in more than one individual serpentine fin. In an embodiment, the fin layer is a single continuous serpentine fin.

In an embodiment, the radiator further comprises a fan attached to the fastening means, where the fin densities of the fin layers of the radiator are adapted specifically to velocity function of the attached fan.

Thereby, the thermal work capacity of each section is further improved, and the specific fan velocity profile is met and utilised by the radiator.

In an aspect, the invention relates to a method of producing the radiator for a liquid cooling system for cooling a computing unit. The method comprises providing a first manifold and a second manifold having among them two liquid openings, for connecting the radiator in a liquid loop. Further, channels and fin layers are stacked between the first manifold and the second manifold. Fastening means are provided attached relative to the manifolds for attaching a fan to the radiator. A shroud can be provided and used that envelopes the periphery of the radiator. In any case, the fastening means determine a ring-shaped high-pressure zone corresponding to an outer area of a fan radius of an attached fan. At least one fin layer has a low-density section placed away from the high-pressure zone, and a high-density section being located in the high-pressure zone and having a higher fin density than the low-density section.

The method of the invention is compatible with the embodiments hitherto discussed relating to the radiator itself.

In certain embodiments, where the fin layers are formed from continuous serpentine fins, the continuous serpentine fins are produced from stock using meshing-toothed gears having teeth of varying circular pitch.

In certain embodiments, where the fin layers are formed from continuous serpentine fins, and the radiator comprises a peak-type fin layer and a valley-type fin layer, the peak-type fin layer and the valley-type fin layer have mutually mirrored fin density gradients, whereby they can be produced by the same toothed gear and cut from one continuous serpentine stock.

Thereby, it is inexpensive to set up production for the adapted fin layers since fewer production lines need to be established to produce effective fin layers, in some embodiments only a single production line.

This is compatible with both meshed gear production and stamped production methods, as long as the fin densities oscillate from high density to low density. In an embodiment of the invention, where at least three different fin densities are used, oscillating between them goes from high density over any intermediary densities in order of descending density to the lowest and back up over any intermediary densities in order of ascending density.

In other embodiments, the serpentine fin is produced by stamping.

Although every given example in the disclosure describes a 1U radiator useful with a single fan, the invention is obviously also applicable to radiators with any different number of fans, such as 2U, 3U and 4U.

BRIEF DESCRIPTION OF THE DRAWINGS

In the following, example embodiments are described according to the invention, where.

DETAILED DESCRIPTION

In the following, the invention is described in detail through embodiments thereof that should not be thought of as limiting to the scope of the invention.

In the following, example embodiments are described according to the invention that should not be considered limiting to the scope of the invention.

Figure 1:
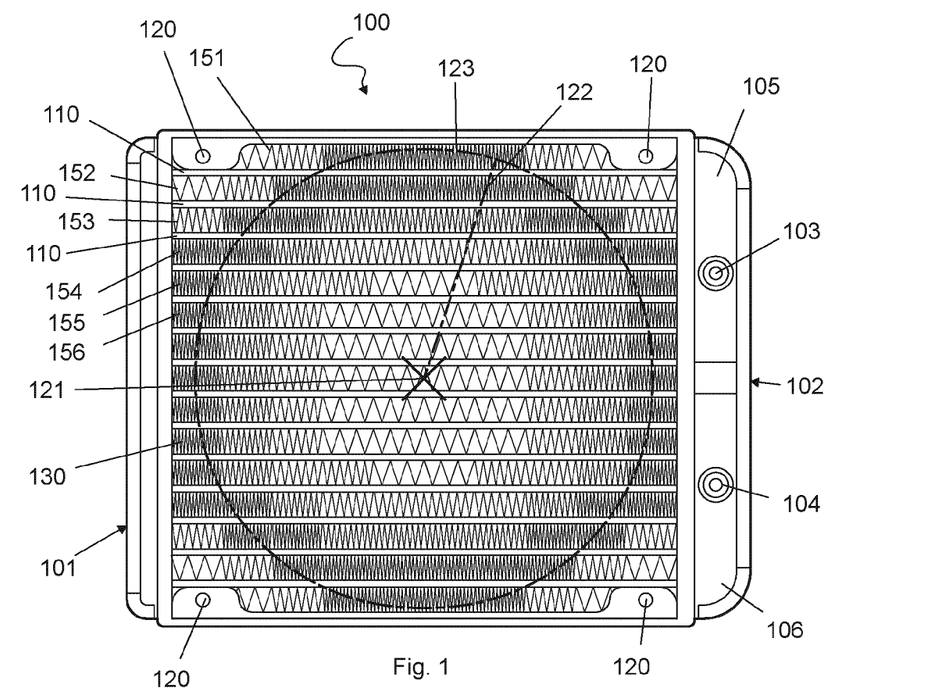
FIG. 1 is a top view of a radiator of an embodiment.

FIG. 1 is a top view of a radiator 100 according to an embodiment. The radiator is a liquid-to-air heat exchanger adapted to be inserted in a liquid cooling loop for cooling a computing unit such as a domestic stationary PC or a server-grade computing unit.

The radiator 100 has two opposing manifolds; a first manifold 101 and a second manifold 102. The first manifold is simply a redistributing manifold, while the second manifold 102 comprises both the inlet manifold 105 with a liquid opening 103 and outlet manifold 106 with a liquid opening 104.

The radiator has a plurality of channels 110 that connect the first manifold 101 to the second manifold 102 and allow liquid transport. Between each set of neighbouring channels, a serpentine fin layer 130 is sandwiched. The fin layers 130 improve heat exchange by increasing surface area between the air and the radiator 100.

In use, the liquid flows through a liquid opening 103, into an inlet manifold 105, through a first set of the channels 110, to the redistributing manifold, back through the remainder of the channels, to the outlet manifold 106, and out of a liquid opening 104. Having the inlet and outlet manifolds on the same side of the radiator and a redistributing manifold opposite is simply one embodiment which makes the radiator easy and convenient to install while doubling the liquid path. However, in other embodiments, the first manifold 101 may be connected directly to the liquid loop as well by having a liquid opening 103 as well.

Fastening means 120 allow easy and user-friendly mounting of fans against the surface of the radiator. This allows minimal air to escape between the fan and the radiator thus providing optimal thermal exchange as well as making it easier to place the fan in the correct location in the computing unit. The fastening means are adapted to fit at least one type of fan, preferably following some fan standard. Some conventional fan standard sizes are 40 mm, 60 mm, 80 mm, 92 mm, 140 mm, and 160 mm. Other sizes exist and may be used as well. When a fan is mounted to the radiator using the fastening means 120, these determine an expected fan size according to the standard fittings of the fan to be mounted. Such an expected fan size has a rotational axis 121, a fan radius 122 and a radial periphery 123.

Generally, when fastening means 120 become denser, they also obstruct the air path more which increases the pressure drop/pressure loss of the air passing through the radiator 100. This reduces air speed which reduces thermal exchange. Therefore, when designing a radiator for maximal heat exchange, surface area increase of denser fin layers must be weighed against the pressure drop exerted on the air passing through such denser fin layer. This, there is an optimal range of fin densities that depends on a range of factors, such as fan type and tolerable noise levels.

The radiator 100 has differentiated fin densities throughout each fin layers 130.

By differentiating the fin density throughout the extension of the fin layer 120, the thermal efficiency of the radiator is further enhanced, because different air speeds/pressures are accommodated over the radiator surface. Even though the space between the fan and the radiator is at least partially open, it has been found that the pressure does not fully smooth out over the radiator surface. Different parts of the radiator are thus adapted to different expected air speeds/pressures in a manner whereby the areas that receive the highest speeds/pressures have the densest fin sections, while areas with lower air speeds/pressures have lower density fin sections.

In the shown embodiment, the fin layers are formed from sheets of highly conductive and brazing-ready metal bent into a serpentine path. The radiator is formed using five unique serpentine shapes, where, from the top, five unique shapes are used 151, 152, 153, 154, 155 in turn, and then, five serpentine fin layers 156 with identical shape are used. Then, the bottom part is formed using the first five unique shapes 151-155 again, but in reverse. This combined layout approximates the airflow profile of an attached fan. Furthermore, it can be noted that each fin layer 130 is shaped as a discrete number of fin sections—10 in the shown embodiment—and that the fin densities of each fin section vary among a discrete number of densities. This allows easy machining and improved thermal exchange. Both of the fin sections and the fin densities will be discussed in relation to the figures.

Naturally, it is also within the scope of the invention to adapt the fin density of the fin layers continually over their extension instead of as discrete alternatives within discrete sections.

As can be seen from FIG. 1 the density of the fin layers varies both parallel to the channel direction and transverse to the channel direction and this results in that the variation of density in the group of fins between the channels varies in two dimensions. In the example illustrated in FIG. 1 this results in a two dimensional fin density pattern which has a circular-like shape optimized to a fan size having a rotational axis 121, a fan radius 122 and a radial periphery 123. It is though not the same fin density variation that are used in each fin layer between each channels, instead the fin density variation differs from some layers to other layers and thereby from some channels to other channels.

Figure 2:
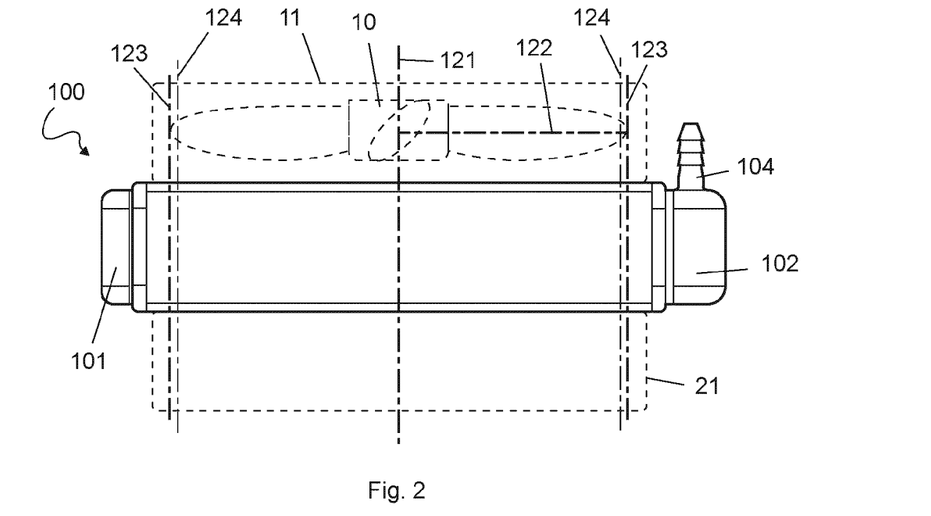
FIG. 2 is a side view of the radiator shown in FIG. 1.

FIG. 2 is a side-view of the radiator 100 shown in FIG. 1. A liquid opening 104 protrudes from the second manifold 102, the other liquid opening not being visible as it is behind the shown liquid opening 104. The first manifold 101 is opposite the second manifold 102. Attaching a fan housing 11 to the fastening means of the radiator (not shown) along the attachment axes 124 will have the fan housing 11 sit approximately in the dashed area thus locating the fan 10 as shown. Then, the attached fan has a rotational axis 121, fan radius 122, and a radial periphery 123.

Another fan housing 21 can be attached to the radiator opposite the discussed fan by using similar attachment means. The fan is not shown but can be similar or identical. Obviously, sizes may vary.

The radiator 100 shown in FIGS. 1 and 2 is what is termed a 1U radiator, meaning that it will fit one fan unit on either side. In other embodiments, the radiator may be 2U, 3U, 4U or any other size.

Figure 3:
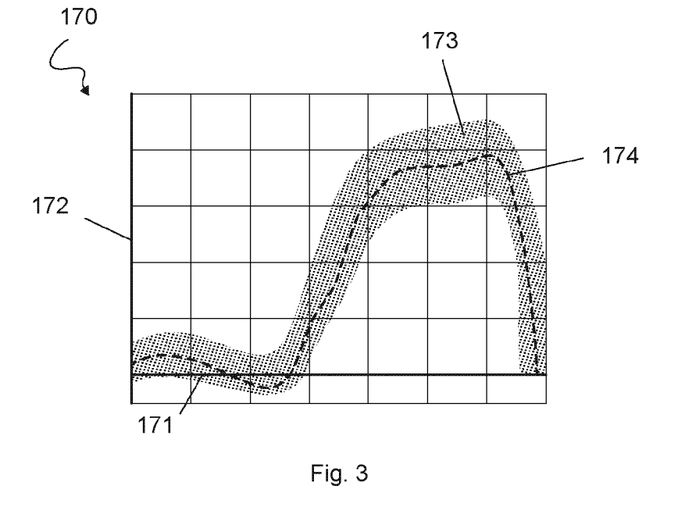
FIG. 3 is a velocity function for a 140 mm fan.

FIG. 3 is a fan flow diagram 170 for a 140 mm fan. The x-axis 171 indicates the radius of the fan in centimetres, while the y-axis 172 denotes air velocity in m/s. Each horizontal and vertical line denotes an increment of 1 cm and 1 m/s, respectively. Thus, the velocity function 174 characterises a specific fan and is used to specify that specific fan. The velocity function 174 is entirely dependent on rotational speed, resistance and geometry of the specific test and thus, no general precise predictions can be made about all fans.

Looking at the specific velocity function, we can at least for the characterised fan see that the speeds produced vary greatly over the radius of the fan. The fan generates no or very little airflow from r=0 to r=2.5 cm, approximately the central 40% of the fan radius. Between r=2.5 and r=4.5, the fan displays a sharp increase in air flow generated which remains high to a little less than r=6.5 cm which corresponds to approximately the tip of the fan blades. It can be seen that something between half and two thirds of the airflow is generated between r=4-6 cm.

Generalising a bit, we can say that the fan produces most or almost its entire airflow between 65% and 90-95% of its radius. The very outermost end has to meet different constructional limitations, where vibrations, oscillations and hitting the fan housing are to be avoided which may limit the efficacy of maximising the very end parts of the blade.

There is a bit of backflow at the centre of the fan which may not be a problem. Since the rotational force is generated in a central housing, it is typical to not have fan blades in the middle, and so the middle part actually obstructs airflow.

Although this is, as mentioned, the velocity profile of a specific 140 mm fan tested under specific circumstances, certain general tendencies can reasonably be inferred. Since the blade tip has the highest tangential velocity of the fan blade, the blade tip has a higher speed and thus pushes more on the air given an identical dimension. It is generally preferable to take advantage of this simple physical phenomenon, and most conventional fans do indeed have blades that are anywhere from straight to having the largest surface area at about this most effective area.

It can thus be inferred that for conventionally constructed fans, the outermost parts generate more airflow than a central part. The velocity valley 173 outlines an example area within which the velocity function of effectively constructed conventional fans of similar size might result if tested under similar conditions.

Figure 4:
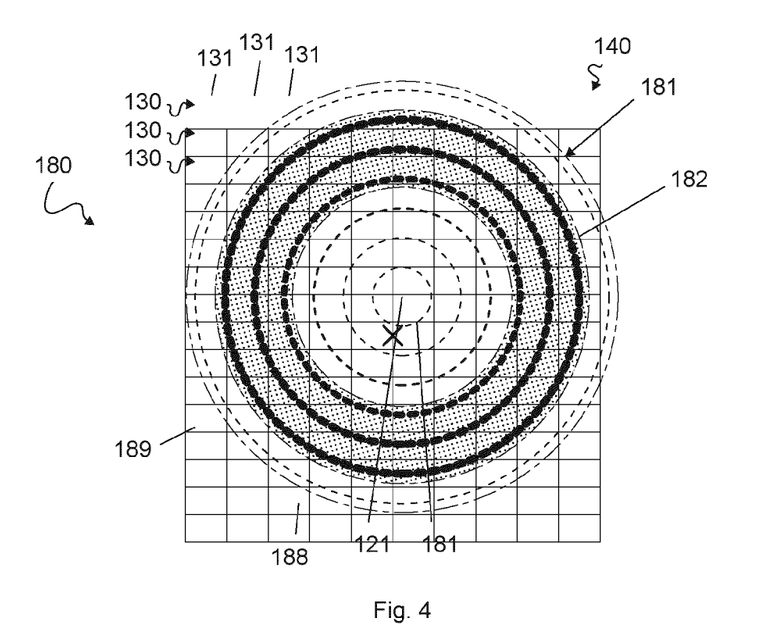
FIG. 4 is a cooling map for a radiator using the velocity function shown in FIG. 3.

FIG. 4 is a cooling map 180 that matches the radiator surface to an airflow map 141 produced by using the velocity function shown in FIG. 3. The radiator surface has a radiator width 189 and a radiator length 188 describing the area of the radiator, where the channels and fin layers are present, between the manifolds. The radiator width 189 is divided into a number of rows corresponding to fin layers 130. The rows are separated by the vertical lines corresponding to channels of the radiator. The radiator length 188 passes between manifolds on either side. Each fin layer 130 is divided up along the radiator length 188 into a number of fin sections 131 resulting in a fin section array 140 of sectioned fin layers 131 for the radiator. The fin array is also associated with a rotational axis 121 of a fan attached to the radiator.

Overlaid on top of the fin section array 140 is an airflow map. The airflow map 141 takes the rotational axis 121 as a centre, then maps the airflow velocity function along a radius away from the rotational axis in all directions. This is shown in the figure by a set of weighted dashed concentric circles indicating velocity.

The set of concentric circles maps the airflow velocity at centimetre increments from the centre and to the seven-centimetre mark. This is done in a weighted fashion, so that the line thicknesses, relative to each other, represent relative airflow velocity accurately at the specified intervals. This provides a visual representation of the airflow velocity over the radiator and thus, at least to a degree, expected cooling performance. The set of concentric circles helps legibility of the figure, though obviously a more accurate map is used for computations. Below 0.5 m/s, a line weight indicating 0.5 m/s has been used for ease of reading the figure.

Within the airflow map 141, a high-pressure zone 142 is clearly evident. It is evident from the airflow map that the majority of the airflow is generated in the ring-shaped high-pressure zone 142, spanning from 65%-95% radius of the fan. Several low-flow zones also exist. The centre is one such low flow zone, and the corners, where the fan blades do not move, are other such low flow zones.

When a radiator of the invention has a fan attached, the differentiated fin density over the radiator surface may obstruct and change the airflow profile. However, this results in a pressure differential, and thus the term high-pressure zone is used. High-flow zone could be used as well, if it is understood to result in a test setting without a radiator of the invention or other differentially blocking objects in the flow path.

Although the pressure and thus speed may smooth out somewhat during use, experiments have shown that it is not entirely the case and that at least a portion of the shown unevenness of the airflow translates to an uneven thermal map of the radiator. Therefore, what is seen in FIG. 4 can be thought of as at least an approximation of cooling at various portions of the radiator. By dividing the radiator into a fin section array 140, each fin section 131 can then be mathematically attributed a cooling gradient describing the amount of thermal work which the specific fin section can perform during use.

By dividing the fin layers 130 into a discrete number of fin sections 131, they may be advantageous to produce. However, in different embodiments, fin sections can be as narrow as desired. In some embodiments, the fin layer has a differentiated fin density, where each individual bend has an individually determined pitch and/or shape determined by the cooling gradient at that specific point or area.

Figure 5:
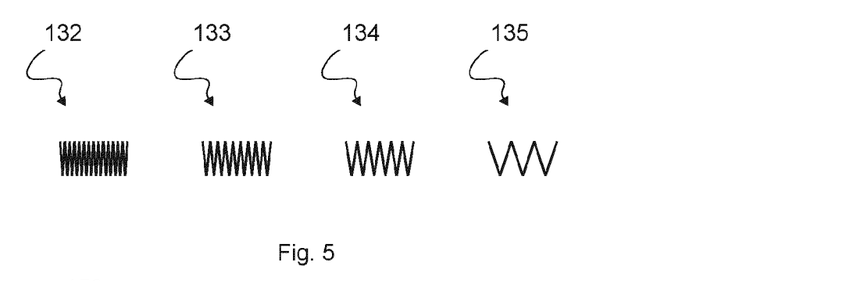
FIG. 5 illustrates four different types of fin sections having each their own fin density.

FIG. 5 illustrates four different types of fin sections having each their own fin density.

A dense fin section 132 has a high fin density with sharp fin pitch and much fin material. This will draw relatively more thermal energy from the channels and provide relatively more airflow resistance than other types of fin sections. The dense fin sections 132 may be too obstructive by themselves to be very useful for many applications. To overcome the high airflow resistance, high static pressure fans must be used and/or the fan must be rotated at very high velocities. This may produce undesirable noise and energy consumption.

A semi-dense fin section 133 is slightly more open and allows more airflow through than the densest fin section 132. The dense fin section 133 may be useful for some applications.

A semi-open fin section 134 is even more open than the semi-dense fin section 133 and may be useful for low-pressure or high airflow operations.

An open fin section 135 may provide relatively little or almost no airflow resistance and may be useful for certain situations, perhaps for even lower noise than the open fin section 134 type or even passive flow.

In other words, all fin densities have each their own benefits and problems.

Figure 6:
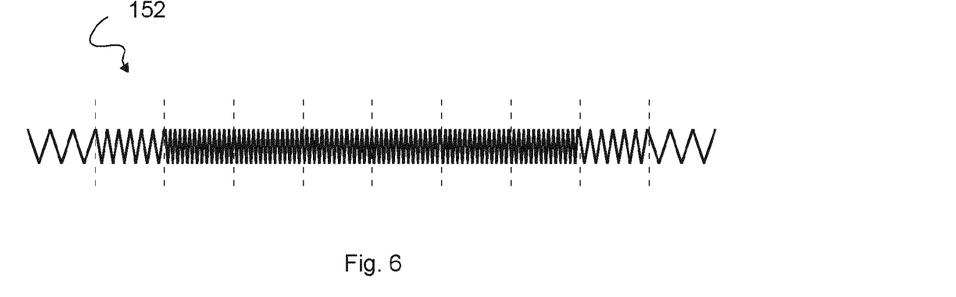
FIG. 6 illustrates a peak-type fin layer according to an embodiment.

FIG. 6 illustrates a peak-type fin layer 152 also shown in FIG. 1. This fin layer type has a higher thermal work capacity at the centre than at its outermost regions. From the left to the centre, the fin layer comprises fin sections by the types: open, semi-open and three dense fin sections. On the other side of the centre, the peak-type fin layer 152 has a layout that mirrors this.

Typically, this is effective, where the fan blade tip comes closer to the centre of the fin layer than to the outermost regions of the fin layer, such as at the top and bottom edges of the radiator. There, the centre of the fin layer matches approximately the radial periphery of the fan blades, while the outermost region of the fin layer corresponds to areas not covered by fan movement.

Figure 7:
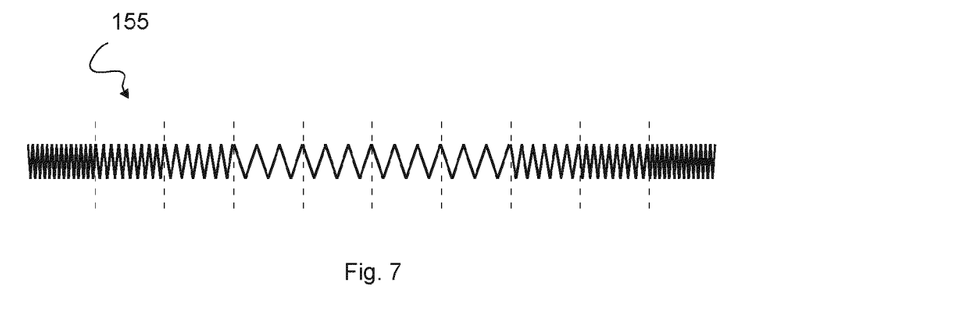
FIG. 7 illustrates a valley-type fin layer according to an embodiment.

FIG. 7 illustrates a valley-type fin layer 155 also shown in FIG. 1. The fin layer has a dense, a semi-dense, a semi-open and two open fin sections from the left to the centre, and a layout on the opposite side that mirrors this. In other words, the fin layer has four different fin densities along its extension, where, at the outermost regions, it is denser than at the centre. Typically, this construction is effective, where the fan blade tip comes closer to the far outermost regions than to the innermost region. This is the case for layers at the centre of the radiator, where the centremost region of the fin layer overlaps the central region of the airflow map.

Both the valley-type fin layer 155 and the aforementioned peak-type fin layer are formed of sheets of conductive material in a pattern that changes/differs over their extensions. More precisely, the shown embodiments of the valley-type and peak-type fin layers comprise a number of sections which have uniform fin density internally, while the fin densities differ among the fin sections.

It should be noted that although the fin sections and fins and fin layers are shown with v-shape serpentine paths, c-shaped serpentine paths are also useful. Further, in another embodiment, the fin densities differ by a gradient over the fin layer extension instead of in discrete homogenous sections.

Figure 8:
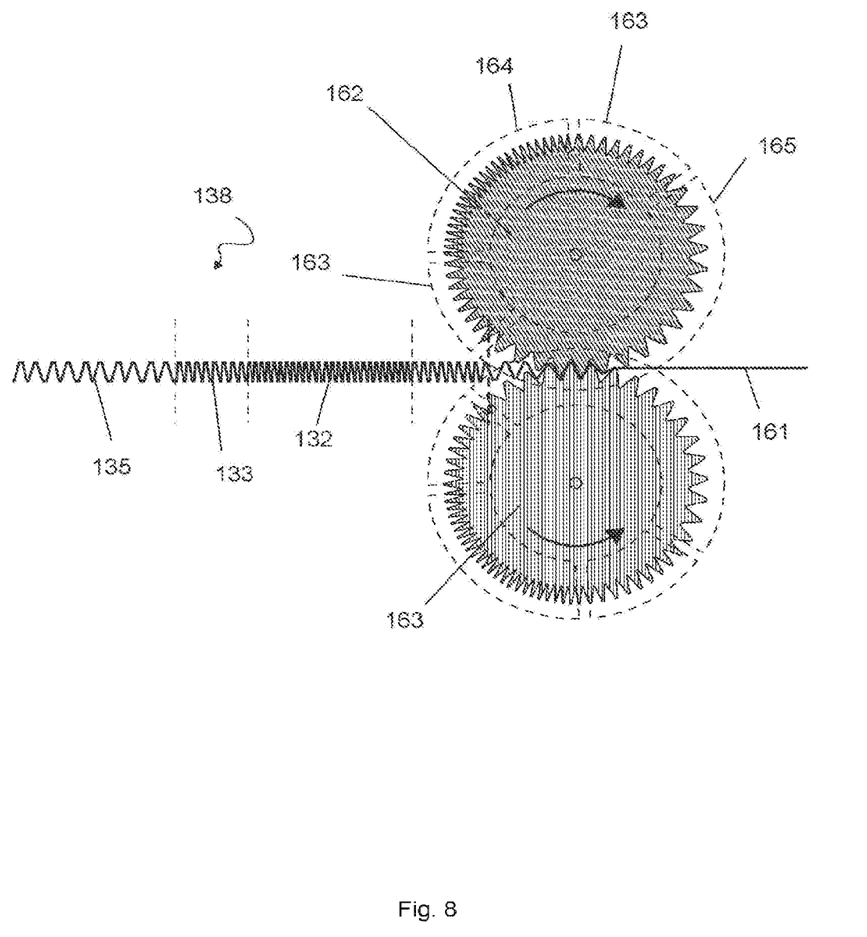
FIG. 8 illustrates an embodiment fabrication process for producing the fin layers of the invention.

FIG. 8 illustrates an embodiment fabrication process for producing the fin layers of the invention.

One effective way of producing radiator fins for the invention is as follows: a brazing sheet 161 is provided rolled up on a roll or as sheet stock. The brazing sheet 161 is fed through a set of meshing gears 162, 163 to produce serpentine stock 138. Then, the serpentine stock 138 is cut or stamped or otherwise modified to provide the final fin shape.

The teeth of the meshing gears 162, 163 differ among different regions of the gears thus producing fins with variable pitch along its extension. A narrow-teeth region 164 produces dense fins, two semi narrow-teeth regions 163 produce semi-dense fins and a wide-teeth region 165 produce open fins 135. This is achieved by the teeth having different pitches and/or widths. The specific gears 162, 163 shown will produce an oscillating pattern from dense, over semi-dense, to open, over semi-dense, to dense, and so on. Using a density-oscillating pattern may be especially advantageous, because fin layers can be produced like shown in FIG. 6 or FIG. 7 depending on where the serpentine stock is cut. If the serpentine stock is cut at the dense regions, the resulting fin layer will be like the one in FIG. 6, while the fin layer will be like the one shown in FIG. 7, if the serpentine stock is cut in the wide regions. Therefore, a single production line can be used to achieve an improved thermal work of the radiator according to the invention.

Although shown as four distinct regions with four internally similar teeth characteristics, the gears may be made to produce seamlessly varied serpentine stock 138, even seamlessly oscillating serpentine stock.

Sometimes more than one set of gears are used to finalise the fin layers, and this is obviously possible to use with the invention as well.

Furthermore, many other fabrication methods can be envisioned. Stamping operations where a pressing tool is used on the brazing stock, such as a hydraulic press, can be used as well.

It is not necessary to use brazing sheets, although it is conventional and an effective way to finalise assembly of the radiator.

Furthermore, instead of providing single sheets for each fin layer and adapting the serpentining process to achieve the differentiated fin densities over a fin layer, it is possible to provide a plurality of individually cut fin sections each with a homogenous fin density instead. These are then simply placed next to each other during radiator assembly. A fin section is placed on a channel, and another different or similar is placed next to it, until the fin layer is filled. In the hydraulic process and/or in the brazing process, the individual fin layer sections will attach and/or adhere to the channels of the radiator and so be fixed in place.

In other embodiments, each fin layer is created to match its unique thermal gradient using a production line, such as meshing gears, that is unique to each different thermal gradient. Three or four or even more production lines may thus be used.

The invention claimed is:

1. A radiator assembly for a liquid cooling system for cooling a computing unit, the radiator assembly comprising:
a first manifold and a second manifold having among them two liquid openings for connecting a radiator in a liquid loop;
channels extending between the first manifold and the second manifold and providing parallel liquid paths between the manifolds;
fin layers sandwiched between sets of neighbouring channels and extending between the first manifold and the second manifold, wherein the fin layers along each of the channels have varying fin densities; and
fastening means for attaching a fan to the radiator in a predetermined position, determining a ring-shaped high-pressure zone corresponding to an outer area of a fan radius of the attached fan, wherein:
at least one fin layer has a low-density section placed away from the high-pressure zone, and a high-density section being located in the high-pressure zone and having a higher fin density than the low-density section;
the density of the group of fin layers thereby varies both along the channels but also transverse of each channel, resulting in two-dimensional density variations across the radiator surface, sections of fins to be positioned in front of the ring-shaped high-pressure zone have a higher density than the section of fins away from the ring-shaped high-pressure zone; and
the fin density is differentiated through each fin layer and thereby adapted to different air speeds or pressures such that the fin density of each fin layer correlates positively with the air speed or pressure at each fin layer.

2. The radiator assembly of claim 1, further comprising at least a peak-type fin layer and a valley-type fin layer, wherein:
the peak-type fin layer has a fin density that is greater in its middle than at either of its ends, and
the valley-type fin layer has a fin density that is lower in its middle than at either of its ends.

3. The radiator assembly of claim 2, wherein
the radiator has an array of fin sections formed by the fin layers each having a plurality of fin sections.

4. The radiator assembly of claim 3, where the radiator comprises fin sections with at least three different fin densities.

5. The radiator assembly of claim 4, where the fin layers comprise continuous serpentine fins.

6. The radiator assembly of claim 5 and further comprising a fan attached to the fastening means, wherein the fin densities of the fin layers of the radiator are adapted specifically to velocity function of the attached fan.

7. A method of producing radiator for a liquid cooling system for cooling a computing unit, the method comprising:
providing a first manifold and a second manifold having among them two liquid openings for connecting the radiator in a liquid loop;
stacking channels and fin layers between the first manifold and the second manifold such that a density of a group of fin layers varies both along the channels and also transverse of each channel, resulting in two-dimensional density variations across the radiator surface; and
providing fastening means attached relative to the manifolds for attaching a fan to the radiator, the fastening means determining a ring-shaped high-pressure zone corresponding to an outer area of a fan radius of the attached fan, wherein:
at least one fin layer having a low-density section placed away from the high-pressure zone and a high-density section being located in the high-pressure zone and having a higher fin density than the low-density section, wherein sections of fins to be positioned in front of the ring-shaped high-pressure zone have a higher density than the section of fins away from the ring-shaped high-pressure zone and wherein the fin layers along each of the channels have varying fin densities; and
the fin density is differentiated through each fin layer and thereby adapted to different air speeds or pressures such that the fin density of each fin layer correlates positively with the air speed or pressure at each fin layer.

8. The method of claim 7, wherein the radiator comprises a peak-type fin layer and a valley-type fin layer, wherein:
the peak-type fin layer has a fin density that is greater in its middle than at either of its ends, and
the valley-type fin layer has a fin density that is lower in its middle than at either of its ends.

9. The method of claim 8, where:
the radiator has an array of fin sections formed by the fin layers each having a plurality of fin sections; and
overlaying a fan airflow map indicative of the airflow generated by the attached fan over the fin section array assigns each fin section with a weighted airflow score indicative of the airflow at that fin section.

10. The method of claim 9, where the radiator comprises fin sections with at least three different fin densities.

11. The method of claim 10, wherein the fin layers are produced as continuous serpentine fins.

12. The method of claim 11, wherein the continuous serpentine fins are produced from stock using meshing-toothed gears having teeth of varying circular pitch.

13. The method according to claim 12, wherein the radiator comprises a peak-type fin layer and a valley-type fin layer, wherein:
the peak-type fin layer has a fin density that is greater in its middle than at either of its ends, and
the valley-type fin layer has a fin density that is lower in its middle than at either of its ends,
wherein the peak-type fin layer and a valley-type fin layer have mutually mirrored fin density gradients, whereby they can be produced by the same toothed gear and cut from one continuous serpentine stock.

14. A liquid cooling loop having a radiator, the radiator comprising:
a first manifold and a second manifold having among them two liquid openings for connecting the radiator in a liquid loop;
channels extending between the first manifold and the second manifold and providing parallel liquid paths between the manifolds;
fin layers sandwiched between sets of neighbouring channels and extending between the first manifold and the second manifold, wherein the fin layers along each of the channels have varying fin densities; and
fastening means for attaching a fan to the radiator in a predetermined position, determining a ring-shaped high-pressure zone corresponding to an outer area of a fan radius of the attached fan, wherein:
at least one fin layer has a low-density section placed away from the high-pressure zone, and a high-density section being located in the high-pressure zone and having a higher fin density than the low-density section;

the density of the group of fin layers thereby varies both along the channels but also transverse of each channel, resulting in two-dimensional density variations across the radiator surface, sections of fins to be positioned in front of the ring-shaped high-pressure zone has a higher density than the section of fins away from the ring-shaped high-pressure zone; and the fin density is differentiated through each fin layer and thereby adapted to different air speeds or pressures such that the fin density of each fin layer correlates positively with the air speed or pressure at each fin layer.

15. A computing system with a liquid cooling loop having a radiator, the radiator comprising:

a first manifold and a second manifold having among them two liquid openings for connecting the radiator in a liquid loop, channels extending between the first manifold and the second manifold and providing parallel liquid paths between the manifolds, fin layers sandwiched between sets of neighbouring channels and extending between the first manifold and the second manifold, and fastening means for attaching a fan to the radiator in a predetermined position, determining a ring-shaped high-pressure zone corresponding to an outer area of a fan radius of the attached fan, wherein:

at least one fin layer has a low-density section placed away from the high-pressure zone, and a high-density section being located in the high-pressure zone and having a higher fin density than the low-density section, and the density of the group of fin layers thereby varies both along the channels but also transverse of each channel, resulting in two-dimensional density variations across the radiator surface, sections of fins to be positioned in front of the ring-shaped high-pressure zone has a higher density than the section of fins away from the ring-shaped high-pressure zone;

the fin density is differentiated through the low-density fin layer and the high-density fin layer adapted to different air speeds or pressures such that the fin density of each fin layer correlates positively with the air speed or pressure at each fin layer.

\* \* \* \* \*